(12) United States Patent
Herner

(10) Patent No.: US 8,394,670 B2
(45) Date of Patent: Mar. 12, 2013

(54) VERTICAL DIODES FOR NON-VOLATILE MEMORY DEVICE

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 20 days.

(21) Appl. No.: 13/149,807

(22) Filed: May 31, 2011

(65) Prior Publication Data

US 2012/0305874 A1    Dec. 6, 2012

(51) Int. Cl.
    *H01L 29/02*      (2006.01)
    *H01L 45/00*      (2006.01)

(52) U.S. Cl. ........... 438/104; 438/22; 438/95; 438/102; 365/148; 257/2; 257/3; 257/4; 257/5; 257/89; 257/295; 257/296; 257/E21.003; 257/E21.004; 257/E29.002; 257/E45.002; 257/E47.001

(58) Field of Classification Search ............ 438/22, 438/95, 102, 104; 365/148; 257/2, 3, 4, 257/5, 89, 295, 296, E21.003, E21.004, E29.002, 257/E45.002, E47.001
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,714,416 A | 2/1998 | Eichman et al. | |
| 5,751,012 A | 5/1998 | Wolstenholme et al. | |
| 5,840,608 A | 11/1998 | Chang | |
| 5,970,332 A | 10/1999 | Pruijmboom et al. | |
| 5,998,244 A | 12/1999 | Wolstenholme et al. | |
| 6,128,214 A | 10/2000 | Kuekes et al. | |
| 6,143,642 A | 11/2000 | Sur, Jr. et al. | |
| 6,259,116 B1 | 7/2001 | Shannon | |
| 6,291,836 B1 | 9/2001 | Kramer et al. | |
| 6,436,765 B1 | 8/2002 | Liou et al. | |

(Continued)

FOREIGN PATENT DOCUMENTS

KR     1020110014248 A    2/2011

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Dao H Nguyen
(74) *Attorney, Agent, or Firm* — Ogawa P.C.

(57) ABSTRACT

A steering device. The steering device includes an n-type impurity region comprising a zinc oxide material and a p-type impurity region comprising a silicon germanium material. A pn junction region formed from the zinc oxide material and the silicon germanium material. The steering device is a serially coupled to a resistive switching device to provide rectification for the resistive switching device to form a non-volatile memory device.

12 Claims, 6 Drawing Sheets

U.S. PATENT DOCUMENTS

| | | | |
|---|---|---|---|
| 6,436,818 B1 | 8/2002 | Hu et al. |
| 6,492,694 B2 | 12/2002 | Noble et al. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,365,411 B2 | 4/2008 | Campbell |
| 7,405,418 B2 | 7/2008 | Happ et al. |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 * | 11/2010 | Schricker et al. ............ 438/104 |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 * | 1/2011 | Kumar et al. .................... 257/2 |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,144,498 B2 | 3/2012 | Kumar et al. |
| 8,164,948 B2 | 4/2012 | Katti et al. |
| 8,207,064 B2 | 6/2012 | Bandyopadhyay et al. |
| 8,227,787 B2 * | 7/2012 | Kumar et al. .................... 257/2 |
| 2004/0026682 A1 | 2/2004 | Jiang |
| 2005/0020510 A1 | 1/2005 | Benedict |
| 2005/0029587 A1 | 2/2005 | Harshfield |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0105284 A1 | 5/2007 | Herner |
| 2007/0105390 A1 | 5/2007 | Oh |
| 2007/0205510 A1 | 9/2007 | Lavoie et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0206931 A1 | 8/2008 | Breuil et al. |
| 2009/0014707 A1 | 1/2009 | Lu et al. |
| 2009/0052226 A1 | 2/2009 | Lee et al. |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157710 A1 | 6/2010 | Lambertson et al. |
| 2010/0176368 A1 | 7/2010 | Ko et al. |
| 2010/0219510 A1 | 9/2010 | Scheuerlein et al. |
| 2010/0321095 A1 | 12/2010 | Mikawa et al. |
| 2011/0133149 A1 | 6/2011 | Sonehara |
| 2011/0155991 A1 | 6/2011 | Chen |
| 2011/0198557 A1 | 8/2011 | Rajendran et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0317470 A1 | 12/2011 | Lu et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043654 A1 | 2/2012 | Lu et al. |
| 2012/0104351 A1 | 5/2012 | Wei et al. |
| 2012/0145984 A1 * | 6/2012 | Rabkin et al. ................... 257/2 |
| 2012/0155146 A1 | 6/2012 | Ueda et al. |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", NATURE, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters, pubs.acs.org/NanoLett, pp. A-E, American Chemical Society Publications.

Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", $9^{th}$ Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9, No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

M. J. Rose et al., "Amorphous Silicon Analogue Memory Devices", Journal of Non-Crystalline Solids, 1989, pp. 168-170, vol. 115, Elsevier Science Publishers B.V., North-Holland.

A. Moopenn et al., "Programmable Synaptic Devices for Electronic Neural Nets", Control and Computers, 1990, pp. 37-41, vol. 18 No. 2.

P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.

J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.

J. Hajto et al., "Electronic Switching in Amorphous-Semiconductor Thin Films", Chapter 14, pp. 640-701.

J. Hajto et al., "Analogue memory and ballistic electron effects in metal-amorphous silicon structures", Philosophical Magazine B, 1991, pp. 349-369, vol. 63 No. 1, Taylor & Francis Ltd.

A. J. Holmes et al., "Design of Analogue Synapse Circuits using Non-Volatile a-Si:H Memory Devices", pp. 351-354.

Yajie Dong et al., "Si/a-Si Core/Shell Nanowires as Nonvolatile Crossbar Switches", Nano Letters, Jan. 2008, pp. 386-391, vol. 8 No. 2, American Chemical Society.

European Search Report for Application No. EP 09 81 9890.6 of Mar. 27, 2012.

D. A. Muller et al., "The Electronic structure at the atomic scale of ultrathin gate oxides", Nature, Jun. 24, 1999, pp. 758-761, vol. 399.

J. Suñé et al., "Nondestructive multiple breakdown events in very thin $SiO_2$ films", Applied Physics Letters, 1989, pp. 128-130, vol. 55.

Herve Marand et al., MESc. 5025 lecture notes: Chapter 7. Diffusion, University of Vermont, http://www.files.chem.vt.edu/chem-dept/marand/MEScchap6-1c.pdf.

A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.

Sung Hyun Jo, "Nanoscale Memristive Devices for Memory and Logic Applications", Ph. D dissertation, University of Michigan, 2010.

Office Action for U.S. Appl. No. 12/894,098 dated Aug. 1, 2012.

Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.

Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.

* cited by examiner

VERTICAL DIODES FOR NON-VOLATILE MEMORY DEVICE

CROSS REFERENCE TO RELATED APPLICATIONS

The present invention is related-to and incorporates by reference, for all purposes, application Ser. No. 11/875,541 filed Oct. 19, 2007.

BACKGROUND

The present invention is generally related to steering elements for switching devices. More particularly, embodiments according to the present invention provide a method and a device structure to form a rectifying element that can be fabricated at low temperatures (<approximately 450 C) and compatible with CMOS processing. Embodiments according to the present invention can be applied to non-volatile memory devices but it should be recognized that the present invention can have a much broader range of applicability.

The success of semiconductor devices has been driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Additionally, switching a PCRAM device requires a large amount of power, and organic RAM or ORAM fabrication techniques are incompatible with large volume silicon-based fabrication and device reliability is usually poor.

From the above, a new semiconductor device structure and integration is desirable.

BRIEF SUMMARY OF THE PRESENT INVENTION

The present invention is generally related to steering elements for switching devices. More particularly, embodiments according to the present invention provide a manufacturing method, a device structure to form a rectifying element at low fabrication temperatures that can then be coupled with a switching element, for example, a resistive switching element, to form a memory cell, a device including processing capability and a memory cell having such a rectifying element, or the like. Embodiments according to the present invention can be applied to non-volatile memory devices, processing devices, or the like, but it should be recognized that the present invention can have a much broader range of applicability.

In a specific embodiment, a steering device structure is provided. The steering device is vertically integrated with a two terminal device and can be fabricated at a temperature less than approximately 450 Degree Celsius. The steering device includes an n-type impurity region and a p-type impurity region. The n-type impurity region includes a zinc oxide material in a specific embodiment. The p-type impurity region includes a p-type silicon germanium material in a specific embodiment. The zinc oxide material and the p-type silicon germanium material form a p-n junction region for the steering device.

In a specific embodiment, a vertical diode coupled with a switching device is provided comprising a memory cell. The non-volatile memory device structure includes a switching device. The resistive switching device includes a first wiring structure, a second wiring structure comprising, and a resistive switching element comprising an amorphous silicon material sandwiched between the first wiring structure and the second wiring structure. In a specific embodiment, the second wiring structure includes an active metal material in physical and electrical contact with the resistive switching material in a specific embodiment. The non-volatile memory device includes a diode device serially coupled to the resistive switching device and disposed between the first wiring structure and the resistive switching element. The diode device includes a zinc oxide material having an n$^-$ type impurity characteristic and a silicon germanium material having a p+ type impurity characteristic. The non-volatile memory device includes an n$^-$p+ junction formed from the zinc oxide material having the n type impurity characteristic and the silicon germanium material having a p+ type impurity characteristic in a specific embodiment.

In a specific embodiment, a method of forming a non-volatile memory device is provided. The method includes providing a substrate having a surface region and forming a first dielectric material overlying the surface region. The method includes forming a first wiring structure overlying the first dielectric material and depositing a metal oxide material having an n– type impurity characteristic overlying the first wiring structure. The metal oxide having the n– type impurity characteristic may be provided using a zinc oxide material in a specific embodiment. A silicon germanium material having a p+ type impurity characteristic is deposited overlying the metal oxide material having the n– type impurity characteristic. In a specific embodiment, a p+n– junction region is formed from the metal oxide material having the n– type impurity characteristic and the silicon germanium material having the p+ type impurity characteristic. The method includes depositing a resistive switching material comprising an amorphous silicon material overlying the silicon germanium material having the p+ type impurity characteristic. In a specific embodiment, the method includes forming a second wiring structure overlying the resistive switching material. The second wiring structure includes at least an active metal material in physical and electrical contact with the resistive switching material in a specific embodiment. In a specific embodiment, the diode device is configured to allow current to flow in a direction of forward bias for the resistive switching device using amorphous silicon as the switching material.

In other implementations, the diode device can be configured in a memory cell to allow current to flow in a reversed bias of a switching device. This allows flexibility for applications in a wide range of switching materials, e.g. phase change chalcogenides, ReRAM metal oxides, and others. These switching materials may use a high voltage and a low current, or a high current and a low voltage, or other combinations for switching. Depending on the embodiment, these switching devices may be switched with the diode in reverse bias or forward bias. Further, the diode device also allows vertical stacking of multiple layers of switching devices and share an interconnect without disturb. Further details are described in the application "Architecture for 3D Memory."

Many benefits can be achieved by ways of the present invention over conventional techniques. Embodiments according to the present invention provide a method and a device structure for a vertically integrated diode that can be fabricated at a temperature no greater than about 450 Degree Celsius. The diode device can be serially coupled with a resistive switching device allowing rectification for the non-volatile memory device in a specific embodiment. The diode device can be fabricated at process temperatures no greater than about 450 Degree Celsius such that the non-volatile memory device can be formed in a backend process of a CMOS device in a specific embodiment. The diode can be implemented depending upon at least a mechanism for switching of the switching element, such that current is allowed to flow in a forward bias or a reverse bias of the switching device. Additionally, the non-volatile memory device can be fabricated using convention semiconductor processing techniques without medication to the existing process equipment. Although a nonvolatile switching element using amorphous silicon material is described, any type of switching element, such as chalcogenide phase change or metal oxide resistance change can be coupled with the steering element. Depending on the embodiment, the steering device may be used in non memory applications, such as logic devices, light emitting diodes (LEDS), flat panel displays, and others. Again, depending upon the embodiment, one or more of these benefits may be achieved. One skilled in the art would recognize other modifications, variations, and alternatives.

DETAILED DESCRIPTION OF THE PRESENT INVENTION

The present invention is generally related to steering elements. More particularly, embodiments according to the present invention provide a method and a device structure to form a rectifying element vertically integrated with a resistive switching device. The steering device can be fabricated at a process temperature less than about 450 Degrees Celsius. Embodiments according to the present invention can be applied to non-volatile memory devices, but it should be recognized that the present invention can have a much broader range of applicability.

High density and low cost storage devices are in ever increasing demand due to the growth in consumer devices common in the market place. Current non-volatile memory devices including Flash are probably at an end to further scaling due to fundamental limitations in the devices. It is predicted that current charge storage in a floating gate or a dielectric material in Flash devices may not be possible in device size less that about 18 nm. A new category of devices using an interconnected crossbar configuration that can be vertically integrated in a three dimensional manner provides a high device density not achievable in current memory devices.

Leakage current from switching elements in an interconnected crossbar array can affect proper operations in a large array of switching elements (for example, read write, or erase) of the device. To reduce the leakage current and to attempt to isolate a cell, rectifying elements can be used. As the (resistive) switching devices are usually fabricated in a backend of a CMOS process, a thermal budget needs to be considered. Accordingly, process temperatures for the disclosed embodiments need to be optimized so as not to affect or degrade CMOS device performance or impair the possibility to use low temperature (and low resistivity) interconnects such as aluminum. Embodiments of the present invention provide a resistive switching device structure that includes at least a rectifying device and related methods that can be processed at temperatures lower than about 450 Degree Celsius, that are compatible with current CMOS process.

Figure 1:
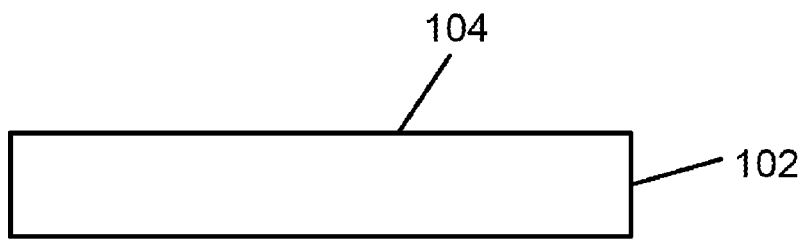
FIG. 1-14 are simplified diagrams illustrating a method of forming a non-volatile memory having rectification according to an embodiment of the present invention.

In a specific embodiment a method of forming a non-volatile memory device is provided as illustrated in FIG. 1-14. As shown in FIG. 1, a substrate 102 having a surface region 104 is provided. The substrate can be a semiconductor material in a specific embodiment. The substrate can include one or more transistor device (for example CMOS device) or others formed thereon. The one or more transistor devices provide controlling circuitry for the switching element or switching element plus steering element, provide computational or logical processing capability, or the like in a specific embodiment. The semiconductor material can be silicon material, including single crystal silicon material, a silicon germanium material, a silicon on insulator substrate, or others, depending on the application.

Figure 2:
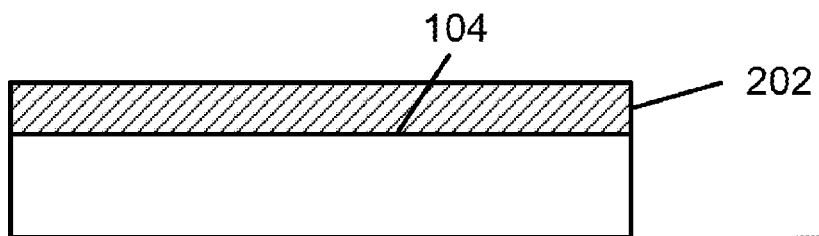

Referring to FIG. 2, a first dielectric material 202 is formed overlying the surface region 104 of the substrate. The first dielectric material can be silicon oxide, silicon nitride, a high K dielectric, or a low K dielectric or a combination including a multilayer dielectric stack depending on the embodiment.

Figure 3:
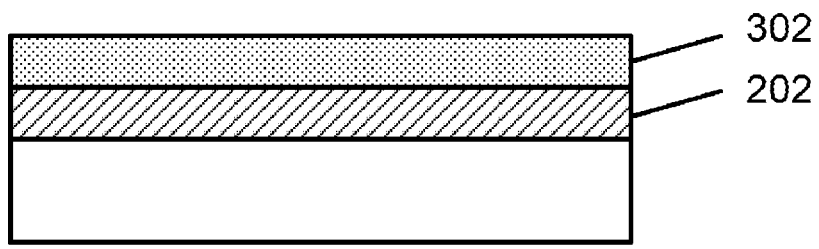

In various embodiments, illustrated in FIG. 3, the method deposits a first wiring material 302 overlying the first dielectric material 202. The first wiring material 302 can be a suitable metal material or a doped semiconductor material, depending on the application. For example, the first wiring material can be those commonly used in semiconductor transistor processing such as copper, tungsten, or aluminum, and others. In some embodiments, the first wiring material may include one or more adhesion layers or diffusion barrier layers allowing the first wiring material 302 to have a proper adhesion to the first dielectric material 202. The adhesion layer can include titanium, titanium nitride, tungsten nitride, tungsten, tantalum, tantalum nitride, and others.

Figure 4:
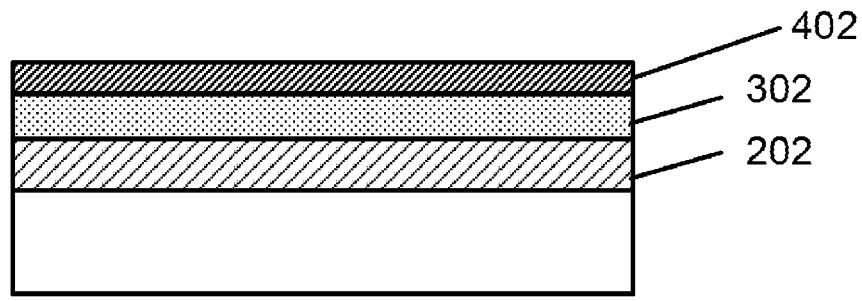

As illustrated in FIG. 4, in a specific embodiment, the method includes depositing a semiconductor metal oxide material 402 overlying the first wiring material 302. The semiconductor metal oxide material 402 can have an n⁻ type impurity characteristic in a specific embodiment. The semiconductor metal oxide material 402 can be formed at a process temperature of less than about 450 Degree Celsius. Further, semiconductor metal oxide material 402 typically has a crystalline or polycrystalline characteristic. In a specific embodiment, the semiconductor metal oxide material 402 can be an intrinsic zinc oxide material that is not intentionally doped.

In various embodiments, the zinc oxide material can be deposited using a physical vapor deposition process such as radio frequency (RF) sputtering using a suitable zinc oxide target. Alternatively, the zinc oxide material 402 can be deposited using a reactive DC magnetron using a zinc target in a presence of oxygen. Deposition temperature can be at room temperature (for example, about 25 Degree Celsius) to about 200 Degree Celsius. The as deposited zinc oxide material 402 typically has an n⁻ type impurity characteristic in a specific embodiment.

Figure 5:
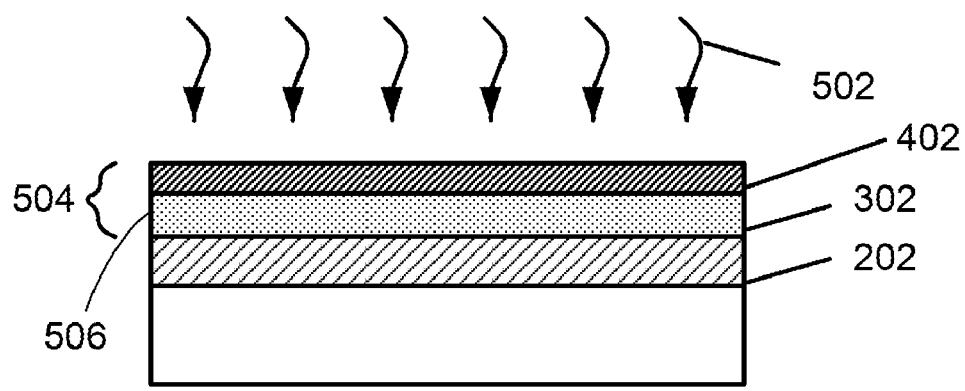
Figure 5A:
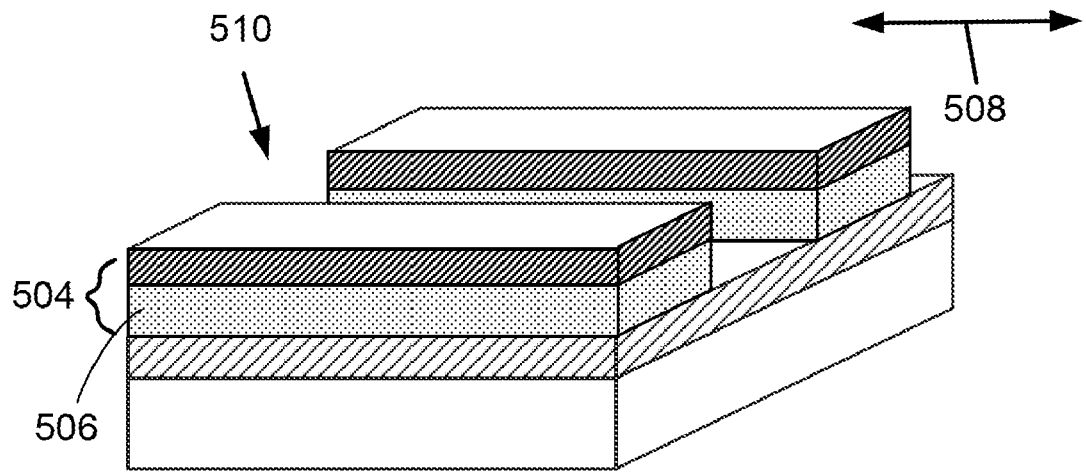

As illustrated in FIGS. 5 and 5A, in a specific embodiment, the method includes subjecting the first wiring material 302 and the zinc oxide material 402 to a first patterning and etching process 502 to form one or more first structures 504 as illustrated in FIG. 5 and FIG. 5A. The one or more first structures 504 typically include a first wiring structure 506 in a specific embodiment. As illustrated in FIG. 5A, the first structure 504 including the first wiring structure 506 is elongated in shape and configured to spatially extend in a first direction 508.

In other embodiments, the zinc oxide material 402 may be further doped using aluminum oxide to form an aluminum doped zinc oxide material, commonly known as AZO. A common reaction mixture is 2 wt % $Al_2O_3$ and 98 wt % ZnO to form an n+ zinc oxide material. Other suitable n-type dopants may be used. These other n-type dopants for ZnO can include $Ga_2O_3$, $B_2O_3$, $In_2O_3$, and others.

Figure 6:
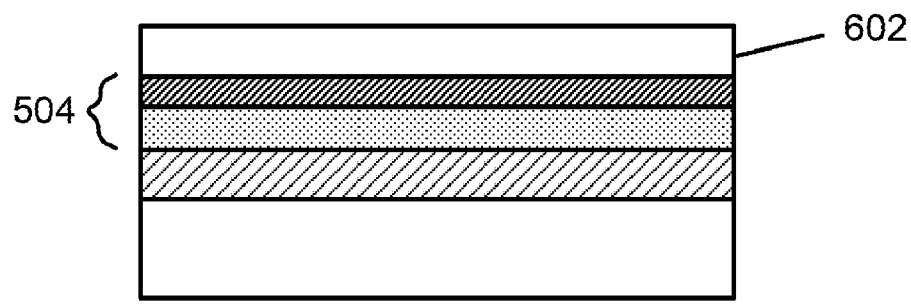
Figure 7:
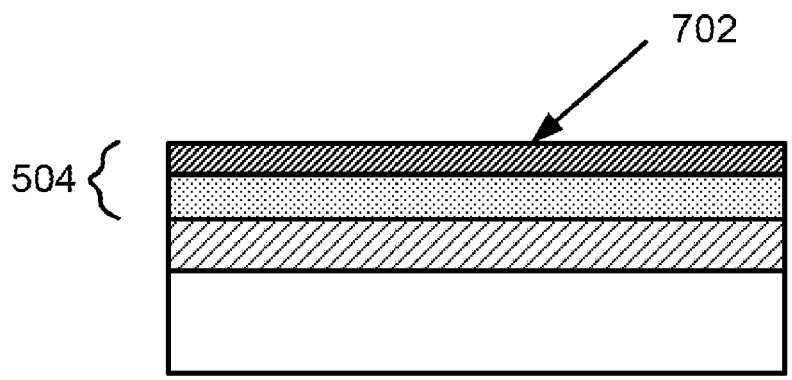

In FIG. 6, in a specific embodiment, the method includes depositing a second dielectric material 602 overlying the first structure 504. Next, as illustrated in FIG. 7, the second dielectric material 602 is subjected to a first planarizing process to expose a surface region 702 of the zinc oxide material. Second dielectric material 602 that fills channels 508 remain and isolate the first structure 504 including the first wiring structure 506 illustrated in FIG. 5A.

Figure 8:
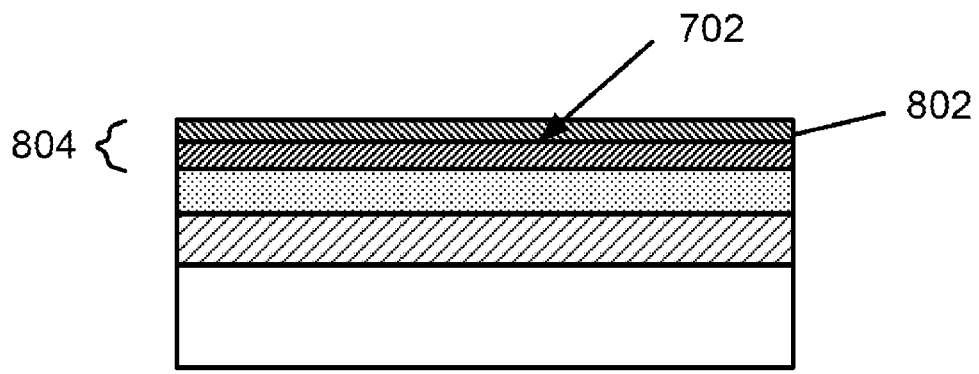

Turning to FIG. 8, in a specific embodiment, embodiments include depositing a silicon germanium material 802 overlying the surface region 702 of the semiconductor metal oxide material 402, for example, zinc oxide material and a surface region of the second dielectric material 602 (within channels 510). In various embodiments, the silicon germanium material 802 may be doped to have a p+ impurity characteristic.

In various embodiments, the silicon germanium material 802 having the p+ type impurity characteristic can be deposited using a chemical vapor deposition (CVD) process, including plasma enhanced CVD, low pressure CVD, and others. In some examples, deposition temperature can range from about 350 Degree Celsius to about 430 Degree Celsius and preferably no higher than 450 Degree Celsius. In a specific embodiment, the p+ silicon germanium material is deposited using disilane ($Si_2H_6$) as a silicon precursor, germane ($GeH_4$) as a germanium precursor, and the p+ impurity as a boron species. The boron species can be provided using diborane, boron chloride, or the like, depending on the embodiment. The deposited p+ silicon germanium material 802 is typically crystalline without further anneal.

In various embodiments, the n-type zinc oxide material 402 (doped or undoped) and the p+ silicon germanium material 802 form a p+n⁻ junction for a diode device 804 or a steering device in a specific embodiment. The diode device 804 can be vertically integrated and serially connected to a switching device to improve rectification for the switching device, described below, in a specific embodiment.

Figure 9:
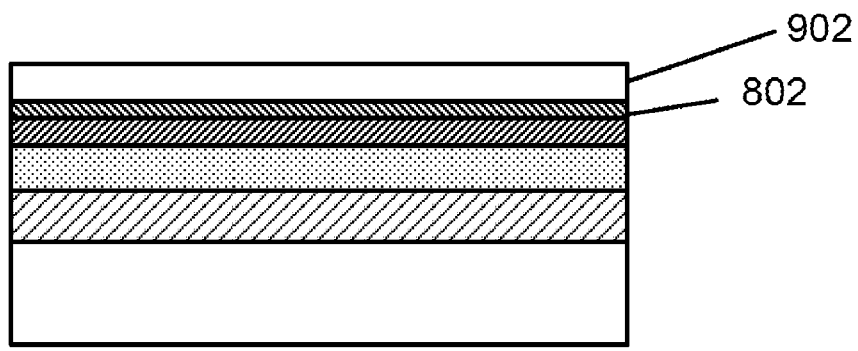

Various embodiments of the method may include depositing a resistive switching material 902 overlying the p+ silicon germanium material 802 as shown in FIG. 9. The resistive switching material 902 is characterized by a state, for example, a resistance state dependent on an electric field in the resistive switching material. In a specific embodiment, the resistive switching material 902 is an amorphous silicon material. The amorphous silicon material is essentially intrinsic and not intentionally doped in a specific embodiment. In a specific embodiment, the amorphous silicon material can be deposited using a low pressure chemical vapor deposition process or a plasma enhanced chemical vapor deposition process using silane or disilane as silicon precursor in a specific embodiment. The silicon precursor may be a suitable chlorosilane in a reducing environment (for example hydrogen) depending on the embodiment. Alternatively, the amorphous silicon material may be deposited using a physical vapor deposition process using a silicon target. Deposition temperature can range from about 250 to about 400 Degree Celsius, depending on the application.

Figure 10:
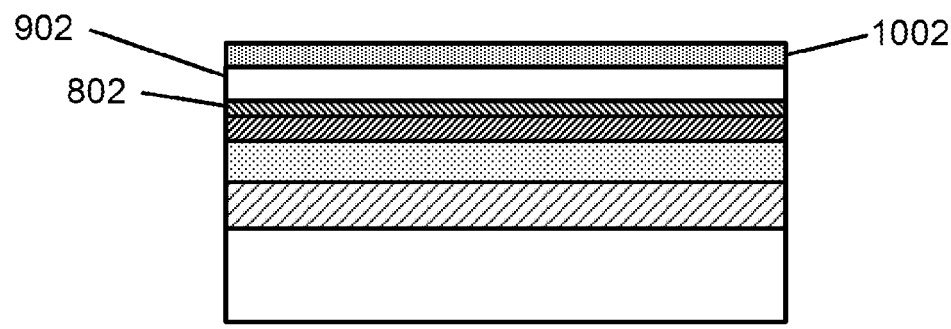

Next, as illustrated in FIG. 10, in a specific embodiment, a metal material 1002 is formed overlying the resistive switching material 902. For amorphous silicon as the resistive switching material 902, the metal material 1002 can be silver, gold, platinum, palladium, aluminum, nickel, and others. The metal material 1002 has a suitable diffusion characteristic in the amorphous silicon material upon application of a voltage or in a presence of a suitable electric field in a specific embodiment. In a specific embodiment, the metal material is silver.

Depending on the embodiment, a diffusion barrier material or an adhesion layer material may be formed overlying the metal material 1002. The adhesion layer material would help prevent the metal material 1002 from diffusing to other parts of the device. Additionally, in a specific embodiment, the diffusion barrier layer material can be titanium nitride, titanium, tungsten nitride, tantalum, tantalum nitride, and others.

Figure 11:
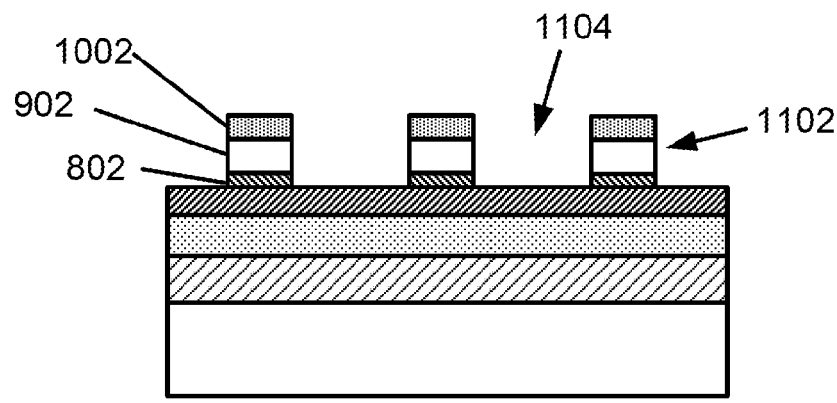
Figure 15:
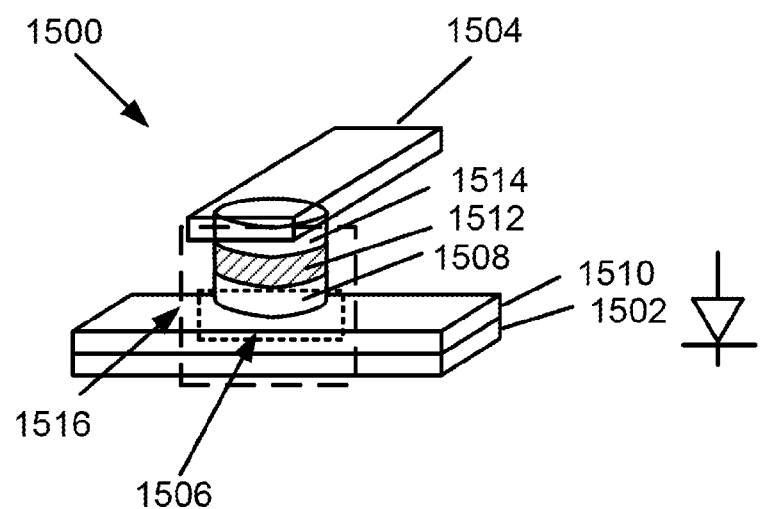
FIG. 15 is a simplified diagram illustrating a device structure of the non-volatile memory device according to an embodiment of the present invention.

Next, as illustrated in FIG. 11, the method subjects a stack of material comprising the diffusion barrier material, the metal material 1002, the amorphous silicon material 902, and the p+ silicon germanium material 802 to a patterning and etching process. As illustrated, one or more pillar structures 1102 may be formed, separated by gap regions 1104. The patterning and etching process may use the diffusion barrier material as a hard mask in a specific embodiment. In various embodiments, the pillar structures 1102 may be square, circular, ovoid, polygonal, rectangular, or the like. An example of this is illustrated in FIG. 15.

Figure 12:
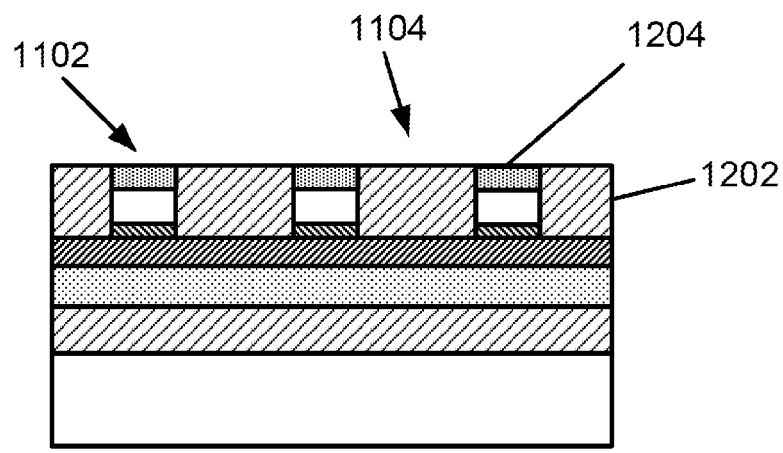

Referring to FIG. 12, he method includes forming a second dielectric material 1202 overlying the one or more pillar structures 1102 and filling the gap regions 1104. The method further subjects the second dielectric material 1202 to a planarizing process to expose a top surface region 1204 of each of the one or more pillar structures 1102 while maintaining the second dielectric material 1202 within the gap regions 1104, in a specific embodiment.

Figure 13:
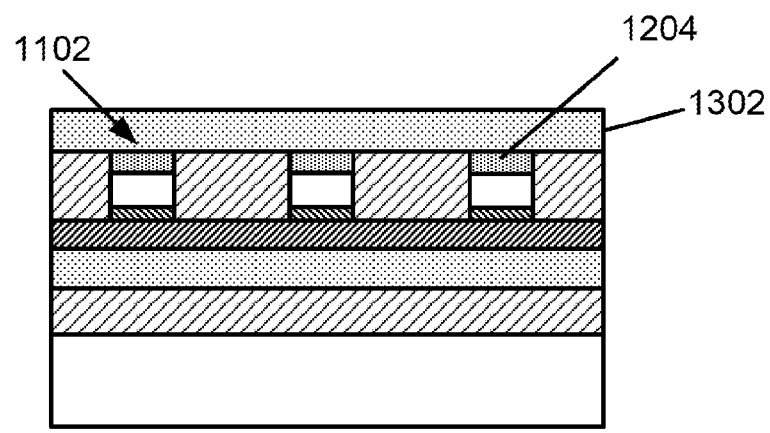

As illustrated in FIG. 13, embodiments of the method forms a second wiring material 1302 overlying the planarized second dielectric material 1202 and the exposed top surface region 1204 of the pillar structure 1102. The second wiring material 1302 can be a suitable metal material such as those commonly used for interconnects in CMOS processing. As merely an example, the second wiring material can be tungsten, aluminum, or copper, and the likes. The second wiring material 1302 can also be a suitably doped semiconductor, metal, or the like, depending on the application.

Figure 14:
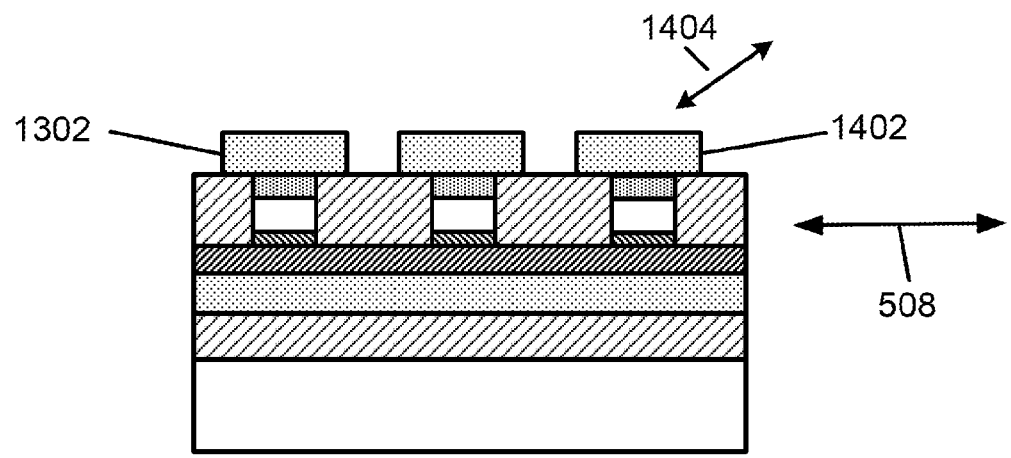

In FIG. 14, in a specific embodiment, the second wiring material 1302 is subjected to a third patterning and etching process to form a second wiring structure 1402 for the state change device. The second wiring structure 1402 is elongated in shape and configured to extend in a second direction 1404 at an angle to the first direction 508 of the first wiring structure 506. In various embodiments, first direction 508 and second direction 1404 may be orthogonal, angled, skew, or the like.

In a specific embodiment, the pillar structure 1102 is a resistive switching element disposed in an intersection region formed from a second wiring structure 1402 and the first wiring structure 506, as shown.

In a specific embodiment, the first wiring structure 506, the second wiring structure 1402 and the resistive switching material 902 forms a resistive switching device for a non-volatile memory device. The p+ silicon germanium material 802 and the n− zinc oxide material 402 form a diode 804 serially coupled to the resistive switching device providing rectification for the non-volatile memory device in a specific embodiment.

As shown in the simplified diagram in FIG. 15, a perspective view of a resistive switching device 1500 is provided. The device 1500 includes a first wiring structure 1502 and a second wiring structure 1504. As shown, the first wiring structure 1502 and the second wiring structure 1504 are each elongated in shape. The first wiring structure 1502 is spatial arranged at an angle and preferably orthogonal to the second wiring structure 1504 in a specific embodiment. The device 1500 includes a diode device 1506 formed from a first semiconductor material 1508 having a p+ type impurity characteristic and a second semiconductor material 1510 having an n⁻ type impurity characteristic. In a specific embodiment, the first semiconductor material 1508 is a p+ type silicon germanium material and the second semiconductor material 1510 is a semiconductor metal oxide material. In various embodiments, the semiconductor metal oxide material is a zinc oxide material.

In various embodiments, the device 1500 includes a resistive switching element 1512 disposed in an intersecting region of the first wiring structure 1502 and the second wiring structure 1504. The resistive switching element 1512 comprises an amorphous silicon material that is not intentionally doped, in a specific embodiment. In a specific embodiment the device 1500 includes an active metal material 1514 in physical and electrical contact with the resistive switching element 1512 in a specific embodiment. The active metal material 1514 can be a silver material or other suitable metal materials, although other metals may also be used depending on the specific embodiment. These other metal material can include gold, platinum, palladium, platinum, copper, nickel, aluminum, including any combinations of theses, and alloy formed thereof. The active metal material 1514 can be a portion of the second wiring structure 1504 in a specific embodiment. The second wiring structure 1504 including the active metal material 1514, the resistive switching element 1512, and the first wiring stricture 1502 form a resistive switching device 1516 in a specific embodiment. As shown, the diode device 1506 is serially coupled to the resistive switching device 1516 to provide rectification for the resistive switching device 1516. In a specific embodiment such rectification prevents leakage current to interfere with proper operations (Read, Write, or Erase) of the resistive switching device 1516 in an interconnected crossbar array in a specific embodiment.

Referring again to FIG. 15. The active metal material 1514 forms a metal region in a portion of the resistive switching material 1512 to cause a change in a resistance state of the resistive switching material 1512 depending upon application of an operating voltage. For example, the operating voltage can be a write voltage, having a positive bias applied to the second electrode in a specific embodiment. The operating voltage can be an erase voltage after write, having a negative bias applied to the second electrode, in a specific embodiment. Of course, one skilled in the art would recognize other variations, modifications, and alternatives.

Figure 16:
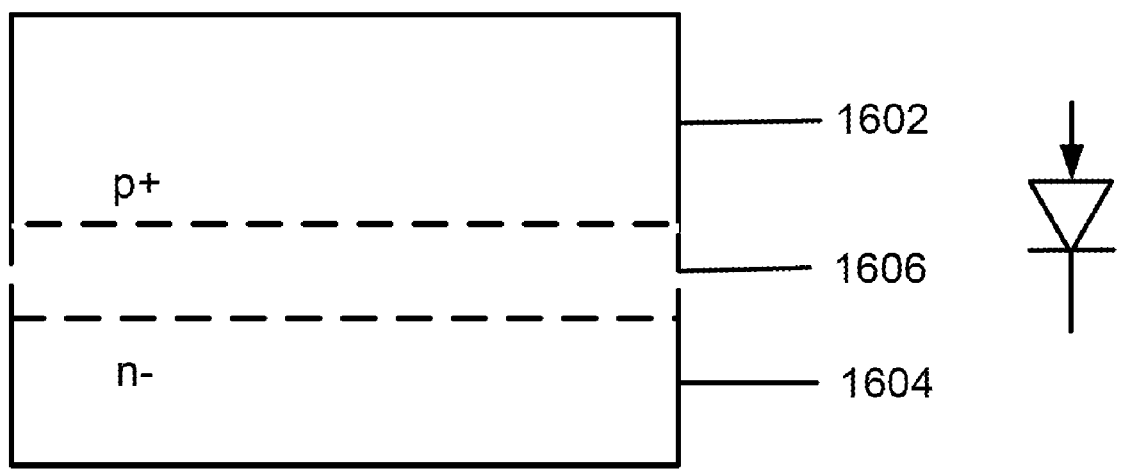
FIG. 16 is a simplified diagram illustrating a steering device according to an embodiment of the present invention.

In a specific embodiment, illustrated in FIG. 16, a steering device structure is provided. The steering device structure includes a p-impurity region 1602, an n-impurity region 1604 and a pn junction region 1606 formed from the p-impurity region 1602 and the n impurity region 1604. The n type impurity region 1604 is provided using a metal oxide material having an n-type characteristic. In a specific embodiment, the metal oxide material includes a zinc oxide material. The zinc oxide material is intentionally undoped and has an n⁻ type impurity characteristic. In other embodiment, the zinc oxide material can be further doped using impurities such as aluminum oxide, gallium oxide, indium oxide, and the likes to form an n type or n⁺ type impurity characteristic. Deposition temperature can range from about room temperature (for example, 25 Degree Celsius) to less than about 100 Degree Celsius. The as formed zinc oxide material (doped or undoped) has a polycrystalline characteristic in a specific embodiment. The p-impurity region 1602 can be formed from a p-type silicon germanium material. The p-type silicon germanium material may be formed polycrystalline at a temperature of less than or equal to about 450 Degree Celsius. These deposition temperatures are intended to be compatible with front end CMOS processes. In a specific embodiment, the p-type silicon germanium material can be doped using a suitable impurity species, for example, a boron species, to have a p+ impurity type characteristic. In a specific embodiment, the steering device can be serially coupled to a two terminal device to provide rectification in a specific embodiment. Depending on the embodiment, the steering device can be connected in a forward bias or reversed bias to the two terminal device. The two terminal device can be a resistive switching device such as ReRAM, PCRAM, and others.

Though the present application has been exemplified in various embodiment, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non-volatile memory device, comprising:
   providing a substrate having a surface region;
   depositing a first dielectric material overlying the surface region;
   forming a first wiring structure overlying the first dielectric material;
   depositing a metal oxide material having an n⁻ type impurity characteristic overlying the first wiring structure;
   depositing a silicon germanium material having a p+ type impurity characteristic overlying the metal oxide material having the n⁻ type impurity characteristic, wherein a p+n⁻ junction region is formed between the metal oxide material having the n− type impurity characteristic and the silicon germanium material having the p+ type impurity characteristic;
   depositing a resistive switching material comprising an amorphous silicon material overlying the silicon germanium material having the p+ type impurity characteristic; and
   forming a second wiring structure overlying the resistive switching material, the second wiring structure comprising at least an active metal material in physical and electrical contact with the resistive switching material.

2. The method of claim 1 wherein the metal oxide material comprises a zinc oxide material.

3. The method of claim 2 wherein depositing the zinc oxide material comprises performing by a physical vapor deposition process at a deposition temperature ranging from about 25 Degree Celsius to about 100 Degree Celsius.

4. The method of claim 2 wherein the zinc oxide material has a polycrystalline characteristic.

5. The method of claim 2 wherein depositing the zinc oxide material comprises performing a process selected from a group consisting of: a radio frequency (RF) sputtering process, a reactive sputtering process, or a magnetron sputtering process.

6. The method of claim 1 wherein performing by the physical vapor deposition process comprises using a zinc oxide target material.

7. The method of claim 1 wherein performing by the physical vapor deposition process comprises using zinc as a target material in an oxygen environment.

8. The method of claim 1 wherein the p+ type impurity characteristic is provided by a p+ type impurity selected from a group consisting of: a boron species, an aluminum species, a gallium species.

9. The method of claim 1 wherein depositing the silicon germanium material having the p+ impurity characteristic comprises performing a chemical vapor deposition process using silane or disilane as a silicon precursor, germane as a germanium precursor, and diborane or boron chloride as a boron precursor.

10. The method of claim 9 wherein performing the chemical vapor deposition process is selected from a group consisting of: a low pressure chemical vapor deposition process, a plasma enhanced chemical vapor deposition process.

11. The method of claim 1 wherein the second wiring structure further comprises a conductive material selected from a group consisting of: copper, tungsten, aluminum, a doped semiconductor material.

12. The method of claim 1 wherein forming the first wiring structure comprises forming the first wiring structure to have an elongated shape and spatially extending in a first direction;
wherein forming the second wiring structure comprises forming the second wiring structure to have an elongated shape and spatially extending in a second direction; and
wherein the first direction is substantially orthogonal to the second direction.

\* \* \* \* \*